(12) United States Patent
Park et al.

(10) Patent No.: US 10,539,623 B2
(45) Date of Patent: Jan. 21, 2020

(54) CHARGING/DISCHARGING CURRENT ESTIMATION DEVICE

(71) Applicant: LG Chem, Ltd., Seoul (KR)

(72) Inventors: Yeon-Do Park, Daejeon (KR); You-Seob Gil, Daejeon (KR)

(73) Assignee: LG Chem, Ltd. (KR)

( * ) Notice: Subject to any disclaimer, the term of this patent is extended or adjusted under 35 U.S.C. 154(b) by 10 days.

(21) Appl. No.: 15/765,655

(22) PCT Filed: Mar. 6, 2017

(86) PCT No.: PCT/KR2017/002399
§ 371 (c)(1),
(2) Date: Apr. 3, 2018

(87) PCT Pub. No.: WO2017/155260
PCT Pub. Date: Sep. 14, 2017

(65) Prior Publication Data
US 2018/0299510 A1  Oct. 18, 2018

(30) Foreign Application Priority Data

Mar. 7, 2016 (KR) .......................... 10-2016-0027243
Mar. 3, 2017 (KR) .......................... 10-2017-0027932

(51) Int. Cl.
*G01N 27/416* (2006.01)
*G01R 31/36* (2019.01)
(Continued)

(52) U.S. Cl.
CPC ........ *G01R 31/3655* (2013.01); *H01M 2/206* (2013.01); *H01M 10/4264* (2013.01);
(Continued)

(58) Field of Classification Search
CPC .. G01R 31/36; G01R 31/3655; G01R 31/367; G01R 31/382; G01R 31/392; G01R 31/396; G01R 1/30; G01R 19/0007
See application file for complete search history.

(56) References Cited

U.S. PATENT DOCUMENTS 4,086,524 A * 4/1978 Kremer ................. G01R 17/10
320/136
6,140,928 A 10/2000 Shibuya et al.
(Continued)

FOREIGN PATENT DOCUMENTS

DE 102013219360 A1 3/2015
JP H04138378 A 5/1992
(Continued)

OTHER PUBLICATIONS

International Search Report and Written Opinion dated Jun. 2, 2017, in Application No. PCT/KR2017/002399.
(Continued)

*Primary Examiner* — Thang X Le
(74) *Attorney, Agent, or Firm* — Lerner, David, Littenberg, Krumholz & Mentlik, LLP (57) ABSTRACT

A current estimation device according to an embodiment of the present disclosure is a device for estimating a charging/discharging current of a battery pack and includes: a shunt resistor connected between a first node and a second node on a charging/discharging path of the battery pack; a shunt capacitor connected between the first node and the second node; a voltage measuring unit connected between the first node and the second node to measure a voltage applied to the shunt resistor; and a current estimating unit configured to estimate the charging/discharging current of the battery pack by using the voltage measured by the voltage measuring unit.

6 Claims, 11 Drawing Sheets

(51) Int. Cl.
  *H01M 10/48* (2006.01)
  *H01M 10/42* (2006.01)
  *H01M 2/20* (2006.01)

(52) U.S. Cl.
  CPC .... *H01M 10/48* (2013.01); *H01M 2010/4271* (2013.01); *H01M 2220/20* (2013.01)

(56) References Cited

U.S. PATENT DOCUMENTS

| | | | |
|---|---|---|---|
| 7,602,144 B2 | 10/2009 | Seo | |
| 8,513,950 B2 * | 8/2013 | Tanabe | G01R 31/364 |
| | | | 324/426 |
| 9,293,242 B2 * | 3/2016 | Yoshioka | H01C 1/14 |
| 2006/0164096 A1 | 7/2006 | Kwon | |
| 2007/0014057 A1 | 1/2007 | Jeon | |
| 2007/0090802 A1 * | 4/2007 | Seo | B60L 3/0046 |
| | | | 320/128 |
| 2011/0199091 A1 | 8/2011 | Tanabe | |
| 2012/0139495 A1 | 6/2012 | Nortman et al. | |
| 2013/0181807 A1 | 7/2013 | Hetzler | |
| 2013/0200700 A1 * | 8/2013 | Ohkura | H01M 2/206 |
| | | | 307/10.7 |
| 2013/0257383 A1 | 10/2013 | Shim | |
| 2015/0102897 A1 | 4/2015 | Hetzler | |
| 2016/0211679 A1 | 7/2016 | Rabbers et al. | |
| 2017/0045586 A1 * | 2/2017 | Kiuchi | G01R 31/025 |
| 2017/0089955 A1 * | 3/2017 | Yugou | G01R 31/364 |

FOREIGN PATENT DOCUMENTS

| | | |
|---|---|---|
| JP | H11133123 A | 5/1999 |
| JP | H11133123 A1 * | 5/1999 |
| JP | 2006267014 A | 10/2006 |
| JP | 2009229405 A | 10/2009 |
| JP | 2015-184142 A | 10/2015 |
| KR | 10-2004-0067459 A | 7/2004 |
| KR | 10-2004-0111062 A | 12/2004 |
| KR | 10-0709258 B1 | 4/2007 |
| KR | 10-0784887 B1 | 12/2007 |
| KR | 10-2010-0090875 A | 8/2010 |
| KR | 10-2013-0106830 A | 9/2013 |
| KR | 10-1448936 B1 | 10/2014 |
| KR | 10-2014-0143874 A | 12/2014 |
| KR | 20150034128 A | 4/2015 |
| KR | 20150120037 A | 10/2015 |

OTHER PUBLICATIONS

Extended European Search Report for Application No. EP17763521.6 dated Oct. 11, 2018.

* cited by examiner

FIG. 11b

CHARGING/DISCHARGING CURRENT ESTIMATION DEVICE

TECHNICAL FIELD

The present disclosure relates to a technology of estimating a charging/discharging current of a battery pack, and more particularly, to a current estimation device having immunity to noise. The present application claims priority under 35 U.S.C. § 119 to Korean Patent Application No. 10-2016-0027243 filed on Mar. 7, 2016, and Korean Patent Application No. 10-2017-0027932 filed on Mar. 3, 2017, in the Republic of Korea, and under 35 U.S.C. § 365 to PCT/KR2017/002399 filed on Mar. 6, 2017, the disclosures of which are incorporated herein by reference.

BACKGROUND

Recently, according to rapid increase in demands for portable electronic products, such as laptop computers, video cameras, portable phones, etc. and earnest development of electric cars, storage batteries for energy storage, robots, satellites, etc., studies of high performance secondary batteries capable of repetitive charging and discharging are actively conducted.

Currently commercialized secondary batteries are nickel cadmium batteries, nickel hydrogen batteries, nickel zinc batteries, lithium secondary batteries, etc. and the lithium secondary batteries thereamong are receiving attention according advantages of free charging/discharging, a very low self-discharge rate, and high energy density since a memory effect is barely generated compared to nickel-based secondary batteries.

A secondary battery is mainly used in a form of a battery pack, and various electronic devices, such as a battery management system (BMS), are embedded in the battery pack. However, such an electronic device may be exposed to an external broadcast signal or various wireless communication signals, and may malfunction due to the external broadcast signal or the various wireless communication signals. Accordingly, such an electronic device needs to be tolerant to electromagnetic waves.

Figure 1:
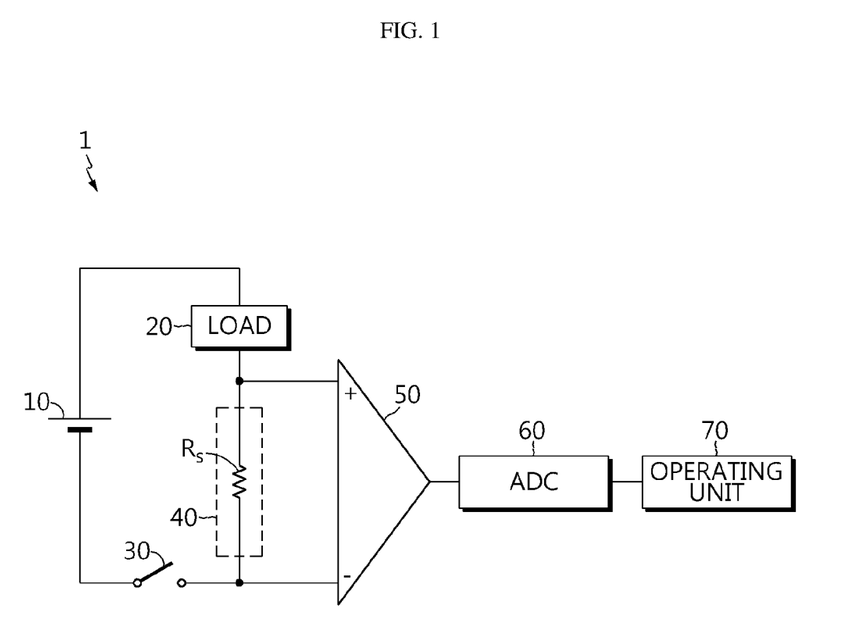
FIG. 1 is a diagram schematically illustrating a charging/discharging current measuring circuit of a battery pack according to a related art.

FIG. 1 is a diagram schematically illustrating a charging/discharging current measuring circuit of a battery pack according to a related art.

Referring to FIG. 1, a charging/discharging current of the battery pack according to the related art is measured by measuring a voltage applied to a shunt resistor $R_s$ and amplifying the voltage. In other words, when a potential difference is generated in the shunt resistor $R_s$ as the charging/discharging current flows through the shunt resistor $R_s$, an amplifying unit 50 amplifies and outputs the potential difference to an analog to digital converter (ADC) 60. The ADC 60 changes the amplified potential difference to a digital signal. An operating unit 70 receives the digital signal, and operates the digital signal to estimate a current flowing through the shunt resistor $R_s$. Here, the operating unit 70 may operate the current flowing through the shunt resistor $R_s$ considering a resistance value and an amplification gain of the shunt resistor $R_s$.

However, when electromagnetic waves, in particular, high frequencies, are applied from the outside, a potential difference is generated in the shunt resistor $R_s$ as impedance of a shunt unit 40 is affected by a skin effect. Even through the potential difference generated in the shunt resistor $R_s$ is not high, the amplifying unit 50 amplifies the potential difference. Thus, the charging/discharging current measuring circuit may misjudge that a charging/discharging current different from an actual charging/discharging current flows in the shunt resistor $R_s$ even when a minute potential difference is generated in the shunt resistor $R_s$.

SUMMARY

The present applicant found out that when a high frequency signal is applied to a battery pack, a potential difference is instantaneously generated in a shunt resistor by a skin effect.

The present disclosure is designed to solve the above problems, and therefore the present disclosure is directed to providing a current estimation device for preventing an error from being generated due to an unexpected high frequency signal.

Also, the present disclosure provides a current estimation device capable of adjusting time spent to estimate a charging/discharging current within a certain range by controlling switches according to an estimate of the charging/discharging current.

These and other objects and advantages of the present disclosure may be understood from the following detailed description and will become more fully apparent from the exemplary embodiments of the present disclosure. Also, it will be easily understood that the objects and advantages of the present disclosure may be realized by the means shown in the appended claims and combinations thereof.

Various embodiments of the present disclosure for achieving the above objectives are as follows. In one aspect of the present disclosure, there is provided a device for estimating a charging/discharging current of a battery pack. The current estimation device includes: a shunt resistor connected between a first node and a second node on a charging/discharging path of a battery pack; a shunt capacitor connected between the first node and the second node; a voltage measuring unit connected between the first node and the second node to measure a voltage applied to the shunt resistor; and a current estimating unit configured to estimate a charging/discharging current of the battery pack by using the voltage measured by the voltage measuring unit.

Also, the voltage measuring unit may include: a filter module; and an amplification module. The filter module may include: a first series arm including a first resistor and a first capacitor connected to the first resistor in series, and connected to the first node; and a second series arm including a second resistor and a second capacitor connected to the second resistor in series, and connected to the second node. The amplification module may include: an amplifier including an input terminal connected to a third node formed between the first resistor and the first capacitor, and an input terminal connected to a fourth node formed between the second resistor and the second capacitor.

Also, the current estimation device may further include two bus bars. Any one of the two bus bars may be configured to connect one end of each of the shunt resistor and the shunt capacitor to the first node. The other one of the two bus bars may be configured to connect the other end of each of the shunt resistor and the shunt capacitor to the second node.

Also, the current estimation device may further include: a first switch connected between the first capacitor and the third node; a second switch connected between the second capacitor and the fourth node; and a switching control unit configured to individually control an operation of the first switch and an operation of the second switch.

Also, the current estimating unit may be configured to output a notification signal corresponding to a magnitude of the estimated charging/discharging current to the switching control unit. The switching control unit may be configured to individually control the operations of the first switch and second switch based on the notification signal.

Also, the current estimating unit may be configured to calculate a current average value of the charging/discharging current estimated a predetermined number of times for a predetermined period of time, and output a first notification signal when the current average value is smaller than a pre-determined current threshold value. The switching control unit may be configured to turn on both the first switch and the second switch according to the first notification signal.

Also, the current estimating unit may be configured to output a second notification signal when the current average value is larger than a pre-determined current threshold value. The switching control unit may be configured to turn off both the first switch and the second switch according to the second notification signal.

In another aspect of the present disclosure, there is also provided a battery pack. The battery pack includes the above current estimation device.

In another aspect of the present disclosure, there is also provided an automobile. The automobile includes the above current estimation device.

According to at least one of embodiments of the present disclosure, even when a high frequency signal is applied to a battery pack, a phenomenon in which a potential difference between both ends of a shunt resistor rapidly changes due to the high frequency signal may be prevented. Accordingly, according to the present disclosure, an error may be prevented from being generated in a current estimate due to an unexpected high frequency signal.

Also, according to at least one of embodiments of the present disclosure, time spent to estimate a charging/discharging current may be adjusted within a certain range by controlling switches according to an estimate of a current.

Also, it may be determined how much noise affecting a charging/discharging current flowing in a battery pack mounted on an automobile or the like is generated by comparing a current value estimated while switches (SW1 and SW2 shown in FIG. 6) are turned off and a current value estimated while the switches are turned on.

In addition, the present disclosure may have other various effects, and the other effects of the present disclosure will be understood by the following descriptions, and will become apparent by embodiments of the present disclosure.

DESCRIPTION OF DRAWINGS

The accompanying drawings illustrate a preferred embodiment of the present disclosure and together with the foregoing disclosure, serve to provide further understanding of the technical features of the present disclosure, and thus, the present disclosure is not construed as being limited to the drawing.

DETAILED DESCRIPTION

Hereinafter, preferred embodiments of the present disclosure will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the description proposed herein is just a preferable example for the purpose of illustrations only, not intended to limit the scope of the disclosure, so it should be understood that other equivalents and modifications could be made thereto without departing from the scope of the disclosure.

Also, in the description of the present disclosure, detailed explanations of related well-known configurations or functions may be omitted when it is deemed that they may obscure the essence of the disclosure.

The terms including ordinal numbers, such as first, second, etc., are used to distinguish various components from one another, and are not used to limit the components.

Throughout the specification, when a part <includes> a component, unless there is a particular description contrary thereto, the part can further include other components, not excluding the other components. In the following description, terms such as <control unit> indicate a unit for processing at least one function or operation, wherein the control unit may be embodied as hardware or software or embodied by combining hardware and software.

In addition, throughout the specification, when a region is <connected> to another region, the regions may not only be <directly connected>, but may also be <indirectly connected> via another device therebetween.

Figure 2:
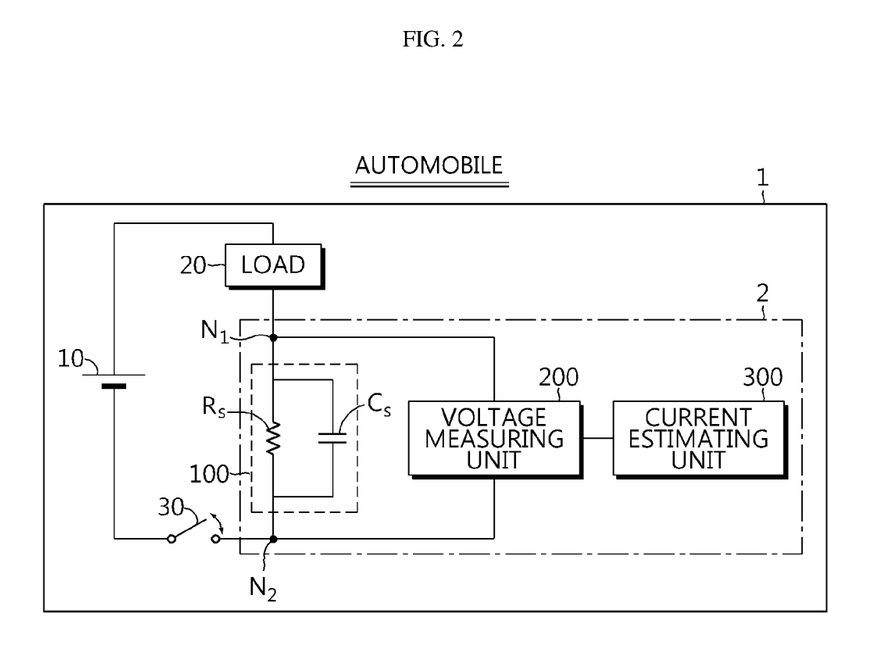
FIG. 2 is a diagram functionally illustrating a configuration of a current estimation device, according to an embodiment of the present disclosure.

FIG. 2 is a diagram functionally illustrating a configuration of a current estimation device, according to an embodiment of the present disclosure.

Referring to FIG. 2, a current estimation device 2 is a device for estimating a charging/discharging current of a battery pack 1 mounted on an automobile or the like, and includes a shunt unit 100, a voltage measuring unit 200, and a current estimating unit 300. The battery pack 1 includes at least one battery 10.

As shown in FIG. 2, the battery pack 1 and a load 20 are selectively connected by a relay 30. When the relay 30 is turned on, a charging/discharging current flows, and when the relay 30 is turned off, the charging/discharging current is blocked. When the relay 30 is turned on, a current flows through a shunt resistor $R_s$ via the battery 10 and the load 20.

The shunt unit 100 includes the shunt resistor $R_s$ and a shunt capacitor $C_s$. The shunt capacitor $C_s$ is electrically connected to the shunt resistor $R_s$ in parallel.

The shunt resistor $R_s$ is connected between a first node $N_1$ and a second node $N_2$ formed on a charging/discharging path of the battery pack 1, and has a predetermined resistance value. A potential difference is generated when a current flows through the shunt resistor $R_s$. The potential difference generated in the shunt resistor $R_s$ is measured by the voltage measuring unit 200 described later, and is used by the current estimating unit 300 to estimate the charging/discharging current.

The shunt capacitor $C_s$ is connected between the first node $N_1$ and the second node $N_2$, and has predetermined capacitance. The shunt capacitor $C_s$ prevents a potential difference from being generated in the shunt resistor $R_s$ by a high frequency component applied from the outside. For example, capacitance of the shunt capacitor $C_s$ may be substantially equal to 15 pF. The capacitance of the shunt capacitor $C_s$ may be optimized to block noise equal to or higher than a pre-determined frequency (for example, 14 GHz).

The voltage measuring unit 200 is connected between the first node $N_1$ and the second node $N_2$. The voltage measuring unit 200 is connected between the first node $N_1$ and the second node $N_2$ to measure a voltage applied to the shunt resistor $R_s$. The voltage measuring unit 200 outputs the measured voltage to the current estimation unit 300 described below.

The current estimation unit 300 estimates the charging/discharging current of the battery pack 1 by using the voltage measured by the voltage measuring unit 200. The current estimation unit 300 may estimate the charging/discharging current per pre-determined time period, based on a size and sign of the voltage measured by the voltage measuring unit 200. According to an embodiment, the current estimating unit 300 may estimate the charging/discharging current by dividing the voltage measured by the voltage measuring unit 200 by a resistance value of the shunt resistor $R_s$. The current estimating unit 300 may include an operating unit, and may be embodied as a part of an integrated chip (IC) or a microprocessor.

Figure 3:
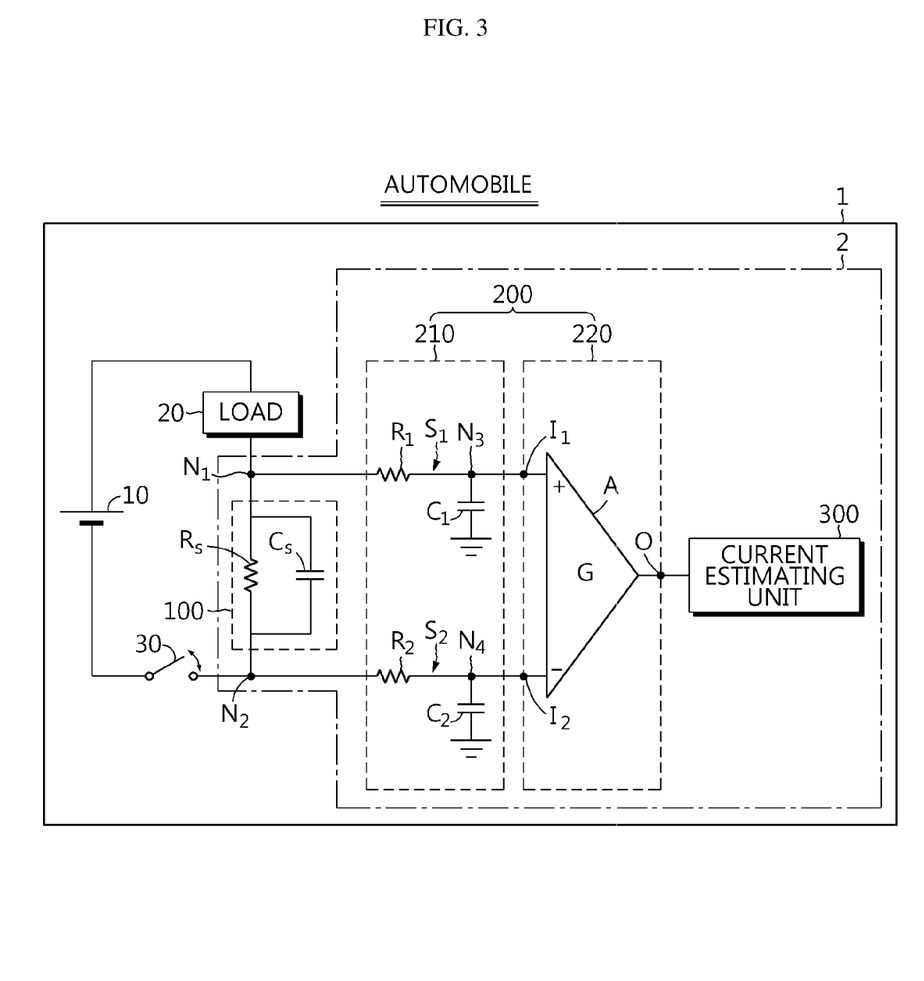
FIG. 3 is a diagram illustrating in detail the configuration of the current estimation device of FIG. 2.

FIG. 3 is a diagram illustrating in detail the configuration of the current estimation device of FIG. 2. The same reference numerals are assigned to components that are same as those shown in FIG. 2, and repetitive descriptions thereof are not provided.

Referring to FIG. 3, the voltage measuring unit 200 includes a filter module 210 and an amplification module 220. The filter module 210 and the amplification module 220 are cascaded in an order of the shunt unit 100, the filter module 210, and the amplification module 220. A third node $N_3$ is a node located between a first resistor $R_1$ and an input terminal $I_1$, and a fourth node $N_4$ is a node located between a second resistor $R_2$ and an input terminal $I_2$.

The filter module 210 includes a first series arm $S_1$ and a second series arm $S_2$.

The first series arm $S_1$ includes a first resistor $R_1$ and a first capacitor $C_1$. The first resistor $R_1$ and the first capacitor $C_1$ may be connected to each other in series. In detail, one end and the other end of the first resistor $R_1$ are respectively connected to the first node $N_1$ and the input terminal $I_1$. One end and the other end of the first capacitor $C_1$ are respectively connected to the third node $N_3$ and the ground. The first resistor $R_1$ and the first capacitor $C_1$ operate as a first low pass filter.

The second series arm $S_2$ includes a second resistor $R_2$ and a second capacitor $C_2$. In detail, one end and the other end of the second resistor $R_2$ are respectively connected to the second node $N_2$ and the input terminal $I_2$. One end and the other end of the second capacitor $C_2$ are respectively connected to the fourth node $N_4$ and the ground. The second resistor $R_2$ and the second capacitor $C_2$ operate as a second low pass filter.

The amplification module 220 may include an amplifier A having the two input terminals $I_1$ and $I_2$, and one output terminal O. The two input terminals $I_1$ and $I_2$ of the amplification module 220 are respectively connected to the third node $N_3$ and the fourth node $N_4$. The output terminal O is connected to the current estimating unit 300. The amplifier A has a predetermined amplification ratio G. The current estimating unit 300 described below may estimate the charging/discharging current considering the amplification ratio G.

Hereinafter, the shunt unit 100 including the shunt resistor $R_s$ and the shunt capacitor $C_s$ will be described in terms of mechanical aspects. The shunt unit 100 is configured to access each of the first node $N_1$ and the second node $N_2$ described above. Here, the first node $N_1$ and the second node $N_2$ may be embodied in connector forms. Meanwhile, as described above, the shunt unit 100 is configured as the shunt resistor $R_s$ and the shunt capacitor $C_s$ are electrically connected in parallel.

Figure 4:
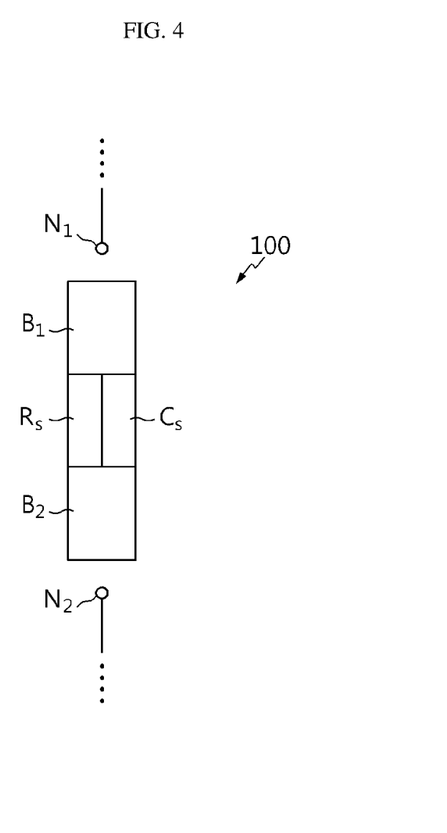
FIG. 4 is a diagram schematically illustrating a configuration of a shunt unit, according to an embodiment of the present disclosure.

FIG. 4 is a diagram schematically illustrating a configuration of a shunt unit, according to an embodiment of the present disclosure.

Referring to FIG. 4, the shunt unit 100 according to an embodiment of the present disclosure includes two bus bars $B_1$ and $B_2$, a resistor element $R_s$, and a capacitor element $C_s$. The resistor element $R_s$ and the capacitor element $C_s$ are stacked in a plate shape, and the two bus bars $B_1$ and $B_2$ are provided at two side end portions where the resistor element $R_s$ and the capacitor element $C_s$ are stacked. The two bus bars $B_1$ and $B_2$ may be respectively electrically connected to the first node $N_1$ and the second node $N_2$ via soldering, welding, or the like. Meanwhile, with respect to the shunt unit 100 illustrated in the embodiment of FIG. 4, the resistor element operates as the shunt resistor $R_s$ of the shunt unit 100 and the capacitor element operates as the shunt capacitor $C_s$ of the shunt unit 100.

Figure 5:
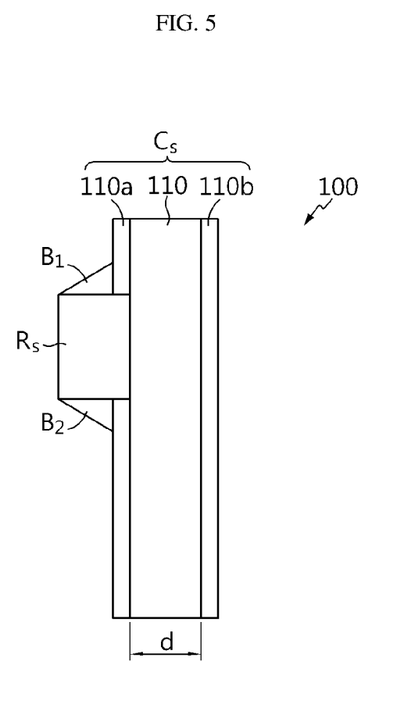
FIG. 5 is a diagram schematically illustrating a configuration of a shunt unit, according to another embodiment of the present disclosure.

FIG. 5 is a diagram schematically illustrating a configuration of the shunt unit 100, according to another embodiment of the present disclosure.

Referring to FIG. 5, the shunt unit 100 according to another embodiment includes a printed circuit board (PCB) plate 110, the resistor element $R_s$, and two bus bars $B_1$ and $B_2$. The PCB plate 110 has a plate shape and is formed of an insulating material. Metal foils 110a and 110b are coated on at least parts of two surfaces of the PCB plate 110. As shown in FIG. 5, the metal foil 110b is coated throughout the bottom surface of the PCB plate 110, and the metal foil 110a may be coated on a part of the top surface of the PCB plate 110. Also, the resistor element $R_s$ is mounted on a part of the top surface where a metal foil is not coated. The two bus bars $B_1$ and $B_2$ contact the resistor element $R_s$ while being spaced apart from each other. The two bus bars $B_1$ and $B_2$ may be electrically connected respectively to the first node $N_1$ and the second node $N_2$ via soldering, welding, or the like. Meanwhile, with respect to the shunt unit 100 shown in the embodiment of FIG. 5, the resistor element operates as the shunt resistor $R_s$ of the shunt unit 100, and the PCB plate 110 operates as the shunt capacitor $C_s$ of the shunt unit 100. In detail, the PCB plate 110 has a thickness d and an area s. Capacitance by the PCB plate 110 is determined by a following equation.

$$Cs = \varepsilon^* \times s/d \quad \text{[Equation 1]}$$

Here, Cs denotes capacitance of a shunt capacitor, ε denotes a dielectric constant of a PCB plate, s denotes an area of the PCB plate, and d denotes a thickness of the PCB plate.

Figure 6:
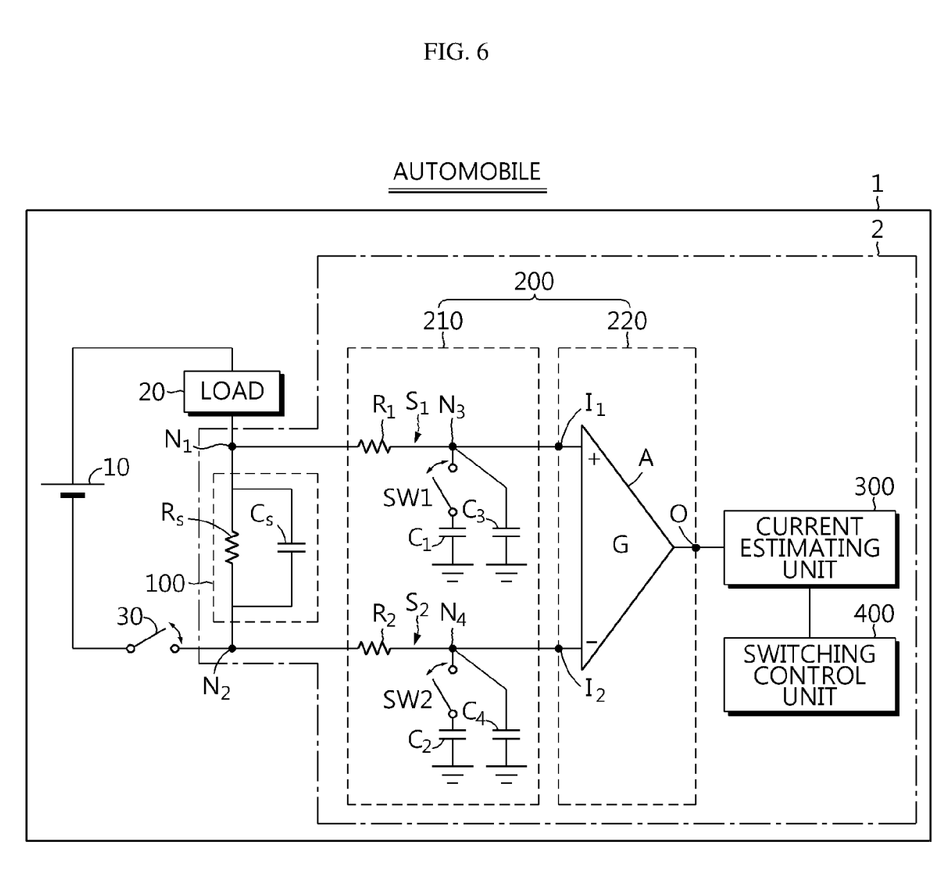
FIG. 6 is a diagram functionally illustrating a configuration of a current estimation device, according to another embodiment of the present disclosure.

FIG. 6 is a diagram functionally illustrating a configuration of a current estimation device, according to another embodiment of the present disclosure, and FIGS. 7 through 10 are reference diagrams for explaining operations performed by the current estimation device of FIG. 6.

In comparison with FIG. 3, the current estimation device 2 of FIG. 6 is different from that of FIG. 3 in that the current estimation device 2 of FIG. 6 further includes a first switch SW1, a second switch SW2, a third capacitor $C_3$, a fourth capacitor $C_4$, and a switching control unit 400. In some cases, the third capacitor $C_3$ and the fourth capacitor $C_4$ may be omitted from the current estimation device 2 of FIG. 6. Hereinafter, the same reference numerals are assigned to components that have been described, and repetitive descriptions thereof are not provided. Also, for convenience of description, it is assumed that capacitance of the first capacitor $C_1$ and capacitance of the third capacitor $C_3$ are the same, and capacitance of the second capacitor $C_2$ and capacitance of the fourth capacitor $C_4$ are the same.

Referring to FIG. 6, the first switch SW1 is connected to the first capacitor $C_1$ in series between the third node $N_3$ and the ground. The third capacitor $C_3$ may be connected between the third node $N_3$ and the ground. While the first switch SW1 is turned on, the first capacitor $C_1$ is electrically connected to the third node $N_3$. Meanwhile, while the first switch SW1 is turned off, the first capacitor $C_1$ is electrically separated from the third node $N_3$. While the first switch SW1 is turned on, the first capacitor $C_1$ and the third capacitor $C_3$ are electrically connected in parallel. Capacitance between the third node $N_3$ and the ground while the first switch SW1 is turned on may be twice of capacitance between the third node $N_3$ and the ground while the first switch SW1 is turned off. It is assumed that a resistance value of the first switch SW1 is so small as to be negligible.

The second switch SW2 is connected to the second capacitor $C_2$ in series between the fourth node $N_4$ and the ground. The fourth capacitor $C_4$ may be connected between the fourth node $N_4$ and the ground. While the first switch SW2 is turned on, the second capacitor $C_2$ is electrically connected to the fourth node $N_4$. One the other hand, while the second switch SW2 is turned off, the second capacitor $C_2$ is electrically separated from the fourth node $N_4$. While the second switch SW2 is turned on, the second capacitor $C_2$ and the fourth capacitor $C_4$ are electrically connected in parallel. Capacitance between the fourth node $N_4$ and the ground while the second switch SW2 is turned on may be twice of capacitance between the fourth node $N_4$ and the ground while the second switch SW2 is turned off. It is assumed that a resistance value of the second switch SW2 is so small as to be negligible.

The switching control unit 400 outputs control signals for individually controlling operations of the first switch SW1 and the second switch SW2. Also, the switching control unit 400 may output a control signal for controlling an operation of the relay 30. The switching control unit 400 is communicably connected to the current estimating unit 300. The current estimating unit 300 outputs notification signals related an estimated charging/discharging current to the switching control unit 400. The switching control unit 400 may selectively output at least one of a first control signal, a second control signal, and a third control signal below, based on the notification signal transmitted by the current estimating unit 300. Of course, the switching control unit 400 may selectively stop output of at least one of the first control signal, the second control signal, and the third control signal below, based on the notification signal transmitted by the current estimating unit 300.

The switching control unit 400 is connected to the first switch SW1 through a first electric line, and the first control signal from the switching control unit 400 is transmitted to the first switch SW1 through the first electric line.

When the switching control unit 400 outputs the first control signal, the first switch SW1 is turned on in response to the first control signal. On the other hand, when the switching control unit 400 stops output of the first control signal, the first switch SW1 is turned off.

The switching control unit 400 is connected to the second switch SW2 through a second electric line, and the second control signal from the switching control unit 400 is transmitted to the second switch SW2 through the second electric line.

When the switching control unit 400 outputs the second control signal, the second switch SW2 is turned on in response to the second control signal. On the other hand, when the switching control unit 400 stops output of the second control signal, the second switch SW2 is turned off.

The switching control unit 400 is connected to the relay 30 through a third electric line, and the third control signal from the switching control unit 400 is transmitted to the relay 30 through the third electric line.

When the switching control unit 400 outputs the third control signal, the relay 30 is turned on in response to the third control signal. On the other hand, when the switching control unit 400 stops output of the third control signal, the relay 30 is turned off.

Meanwhile, quick estimation of a charging/discharging current may be put before a noise removing operation using the shunt capacitor $C_s$, a first low pass filter, and a second low pass filter, based on a situation where the battery pack 1 is operated. For example, since it is more likely, than not, that an overcurrent may flow when a magnitude of a current average value of a charging/discharging current estimated a predetermined number of times for a predetermined period of time by the current estimating unit 300 is greater than a pre-determined current threshold value, the necessity of quickly monitoring the charging/discharging current is higher than the necessity of removing noise. Here, the current threshold value is a criterion for determining generation of an overcurrent. In other words, the current estimating unit 300 may determine that an overcurrent is not generated when the current average value is smaller than the current threshold value, and determine that an overcurrent is generated in other cases.

Let's assume that the first capacitor $C_1$ and the second capacitor $C_2$ maintain to be electrically connected respectively to the third node $N_3$ and the fourth node $N_4$ regardless of the situation where the battery pack 1 is operated. In this case, a temporal delay is inevitably generated until a voltage corresponding to the charging/discharging current flowing through the load 20 is measured by the voltage measuring unit 200 due to capacitance of each of the first capacitor $C_1$ and the second capacitor $C_2$. As a result, it is difficult to quickly estimate the charging/discharging current.

The current estimation device of FIG. 6 may reduce the above problem by operating to selectively connect the first capacitor $C_1$ to the third node $N_3$ by using the first switch SW1, and selectively connect the second capacitor C2 to the fourth node $N_4$ by using the second switch SW2.

In detail, the current estimating unit 300 may compare the current average value and the current threshold value. The notification signal output by the current estimating unit 300 may correspond to a comparison result between the current average value and the current threshold value.

For example, let's assume that it is predetermined that a current threshold value=100 A, a first comparison reference value=0.9, and a second comparison reference value =1.1. Here, a following size relationship may be satisfied.

Size Relationship: 0<First Comparison Reference Value<1< Second Comparison Reference Value If the current average value is smaller than a first comparison current value obtained by multiplying the first comparison reference value by the current threshold value, an overcurrent is not generated. For example, when the current average value=80 A, 'current average value <(current threshold value×first comparison reference value)=first comparison current value'. In this case, the current estimating unit 300 may transmit a first notification signal to the switching control unit 400.

If the current average value is greater than the first comparison current value and smaller than the current threshold value, an overcurrent is not yet generated but a possibility that the overcurrent may be generated is relatively high. For example, when the current average value=90 A, '(current threshold value×first comparison reference value)=first comparison current value <current average value< current threshold value'. In this case, the current estimating unit 300 may transmit a second notification signal to the switching control unit 400.

If the current average value is equal to or greater than the current threshold value but is smaller than a second comparison current value obtained by multiplying the second comparison reference value by the current threshold value, an overcurrent is flowing. For example, when the current average value=102 A, 'current average value<current average value<second comparison current value=(current threshold value×second comparison reference value)'. In this case, the current estimating unit 300 may transmit a third notification signal to the switching control unit 400.

If the current average value is equal to or greater than the second comparison current value, an overcurrent is flowing and a consequent danger is high. For example, when the current average value=115 A, '(current threshold value x second comparison reference value)=second comparison current value<current average value'. At this time, the current estimating unit 300 may transmit a fourth notification signal to the switching control unit 400.

Figure 7:
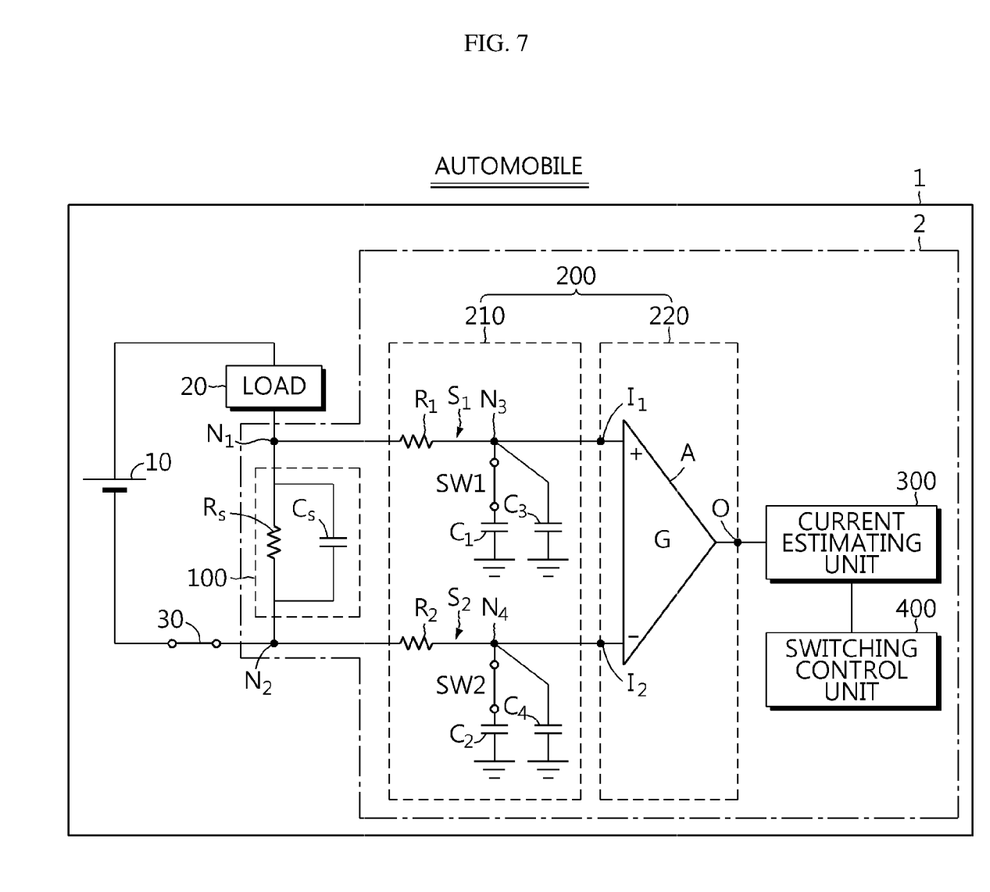
FIGS. 7 through 10 are reference diagrams for explaining operations performed by the current estimation device of FIG. 6.

FIG. 7 illustrates an operation when the switching control unit 400 receives the first notification signal from the current estimating unit 300. Referring to FIG. 7, the switching control unit 400 outputs the first control signal and the second control signal, in response to the first notification signal. Accordingly, the first switch SW1 and the second switch SW2 are both turned on, and thus the first capacitor $C_1$ and the second capacitor $C_2$ are electrically connected respectively to the third node $N_3$ and the fourth node $N_4$. Accordingly, the first capacitor $C_1$ and the third capacitor $C_3$ are electrically connected in parallel, and the second capacitor $C_2$ and the fourth capacitor $C_4$ are electrically connected in parallel.

Figure 8:
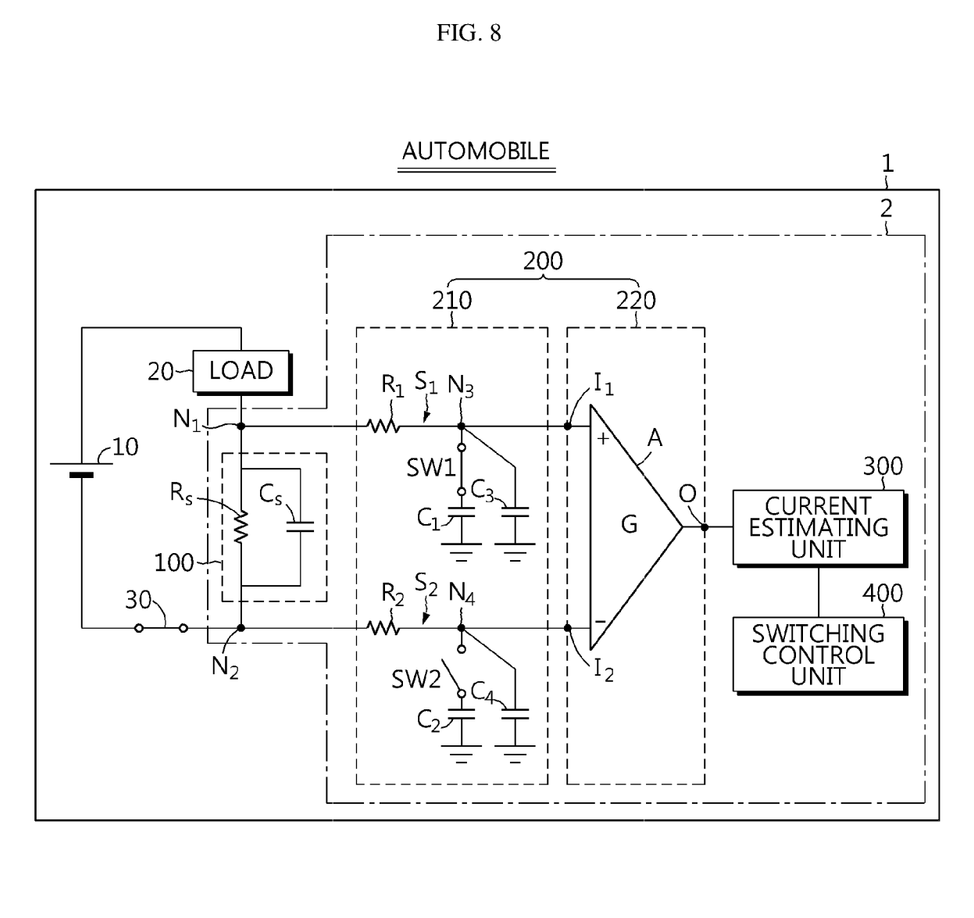

FIG. 8 illustrates an operation when the switching control unit 400 receives the second notification signal from the current estimating unit 300. Referring to FIG. 8, the switching control unit 400 outputs only any one of the first control signal and the second control signal while stopping output of the other one, in response to the second notification signal. For example, when the switching control unit 400 outputs the first control signal while stopping output of the second control signal, only the first switch SW1 from among the first switch SW1 and the second switch SW2 is turned on. Accordingly, the first capacitor $C_1$ is electrically connected to the third node $N_3$ together with the third capacitor $C_3$, while the second capacitor $C_2$ is electrically separated from the fourth node $N_4$.

Figure 9:
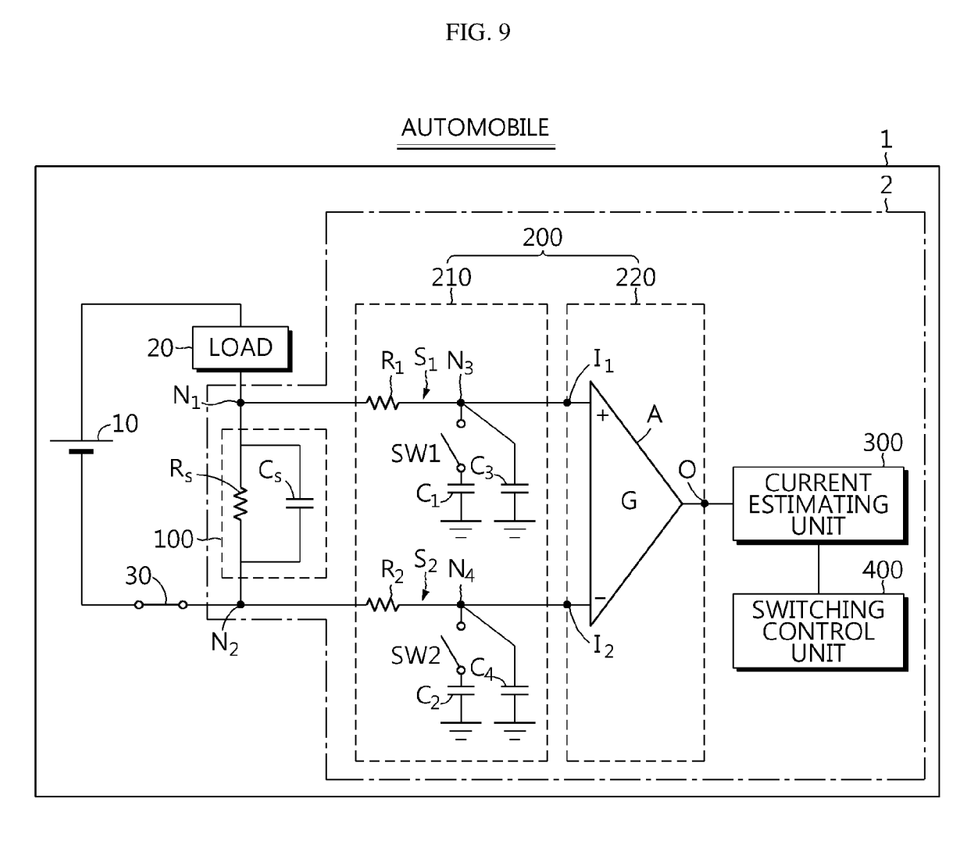

FIG. 9 illustrates an operation when the switching control unit 400 receives the third notification signal from the current estimating unit 300. Referring to FIG. 9, the switching control unit 400 stops output of the first control signal and the second control signal, in response to the third notification signal. Accordingly, the first switch SW1 and the second switch SW2 are both turned off, and thus the first capacitor $C_1$ and the second capacitor $C_2$ are electrically separated respectively from the third node $N_3$ and the fourth node $N_4$. In other words, only the third capacitor $C_3$ from among the first capacitor $C_1$ and the third capacitor $C_3$ is electrically connected between the third node $N_3$ and the ground, and only the fourth capacitor $C_4$ from among the second capacitor $C_2$ and the fourth capacitor $C_4$ is electrically connected between the fourth node $N_4$ and the ground. As a result, in comparison with FIG. 7, capacitance between the third node $N_3$ and the ground and capacitance between the fourth node $N_4$ and the ground are each reduced by ½, and thus the charging/discharging current may be more quickly estimated.

Figure 10:
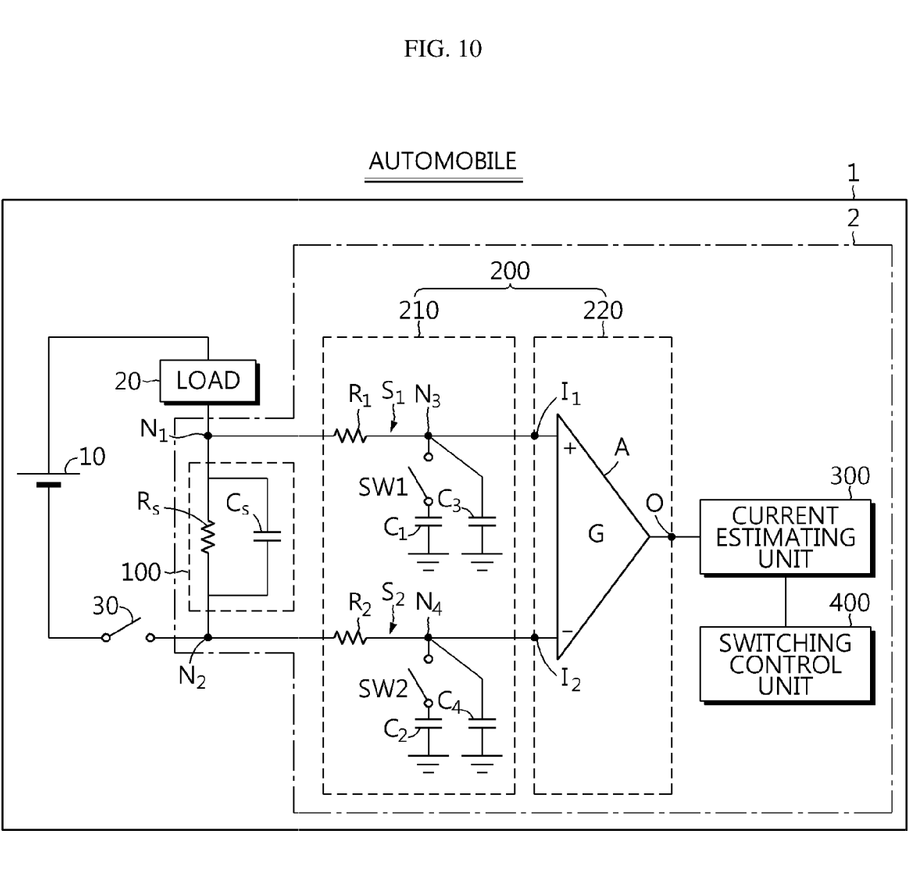

In FIGS. 7 to 9, the switching control unit 400 may output the third control signal. In comparison with this, FIG. 10 illustrates an operation when the switching control unit 400 receives the fourth notification signal from the current estimating unit 300. Referring to FIG. 10, the switching control unit 400 stops output of the third control signal that induces the relay 30 to be turned on, in response to the fourth notification signal. Accordingly, the relay 30 is turned off and the charging/discharging current is completely blocked. In addition, the switching control unit 400 may stop output of the first control signal and the second control signal.

Also, the current estimation device 2 may determine, at predetermined intervals, a size of noise introduced to a charging/discharging path by intercomparing current values estimated a predetermined number of times (for example, 3 times) for a first period of time in which the first and second switches SW1 and SW2 are both turned on and current values estimated a predetermined number of times (for example, 3 times) for a second period of time in which the first and second switches SW1 and SW2 are both turned off. Here, a time difference between a point of time when a current value is estimated within the first period of time and a point of time when a current value is estimated within the second period of time may be less than a threshold value. The switching control unit 400 may output a signal commanding the relay 30 to be turned off when the determined size of noise is equal to or greater than a predetermined level.

Figure 11A:
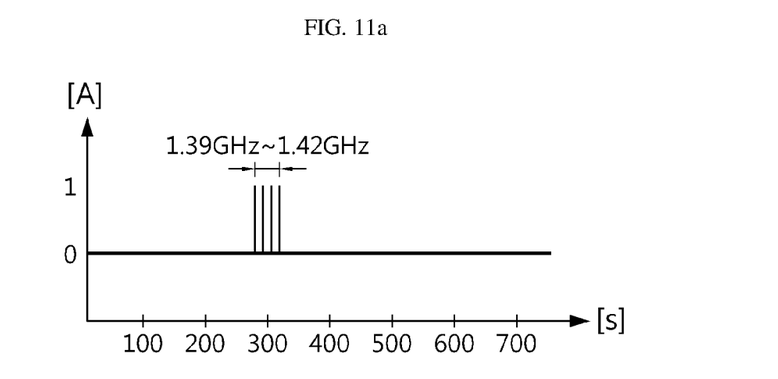
FIGS. 11A and 11B are graphs showing comparison results of radiated interference (RI) tests respectively with respect to the current estimation device of FIG. 1 and the current estimation device of FIG. 3.
Figure 11B:
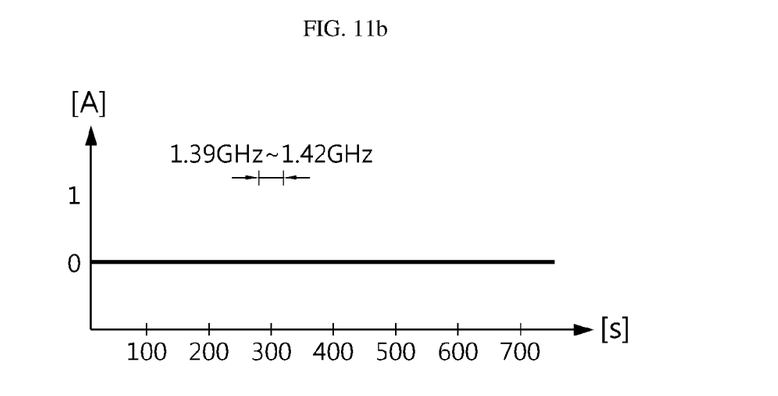

FIGS. 11A and 11B are graphs showing comparison results of radiated interference (RI) tests respectively with respect to the current estimation device of FIG. 1 and the current estimation device of FIG. 3. Here, RI test is a text for observing a degree of radiated interference from among tests related to electromagnetic susceptibility (EMS).

In detail, FIG. 11A is a graph showing a result of performing an RI test when the shunt capacitor $C_s$ does not exist, and FIG. 11B is a graph of performing an RI test when the shunt capacitor $C_s$ exists. FIGS. 11A and 11B illustrate results of estimating charging/discharging currents when the charging/discharging currents do not flow.

Referring to FIG. 11A, a shunt current flows at about 1.39 GHz to 1.42 GHz. In a comparison example of FIG. 11A, the current estimating unit 300 misjudged that a shunt current flows when a potential difference is generated in the shunt unit 100 due to a skin effect in a high frequency domain of 1.39 GHz to 1.42 GHz.

Referring to FIG. 11B, in comparison with FIG. 11A, it is determined that a shunt current does not flow even in the high frequency domain.

As such, the present disclosure provides an effect of preventing generation of a potential difference in the shunt unit 100 in a particular high frequency domain of electromagnetic waves.

The present disclosure has been described in detail. However, it should be understood that the detailed description and specific examples, while indicating preferred embodiments of the disclosure, are given by way of illustration only, since various changes and modifications within the scope of the disclosure will become apparent to those skilled in the art from this detailed description.

Features described in individual embodiments of the present specification may be combined and embodied in a single embodiment. On the other hand, various features described in a single embodiment of the present specification may be embodied individually in various embodiments or in suitable subcombination.

What is claimed is:

1. A current estimation device for estimating a charging/discharging current of a battery pack, the current estimation device comprising:
   a shunt resistor connected between a first node and a second node on a charging/discharging path of the battery pack;
   a shunt capacitor connected between the first node and the second node;
   a voltage measuring unit connected between the first node and the second node to measure a voltage applied to the shunt resistor; and
   a current estimating unit configured to estimate the charging/discharging current of the battery pack by using the voltage measured by the voltage measuring unit,
   wherein the voltage measuring unit comprises:
   a filter module; and an amplification module,
   wherein the filter module comprises:
   a first series arm comprising a first resistor and a first capacitor connected to the first resistor in series, and connected to the first node; and
   a second series arm comprising a second resistor and a second capacitor connected to the second resistor in series, and connected to the second node, and
   the amplification module comprises:
   an amplifier comprising an input terminal connected to a third node formed between the first resistor and the first capacitor, and an input terminal connected to a fourth node formed between the second resistor and the second capacitor,
   wherein the current estimation device further comprises:
   a first switch connected between the first capacitor and the third node;
   a second switch connected between the second capacitor and the fourth node; and
   a switching control unit configured to individually control an operation of the first switch and an operation of the second switch,
   wherein the current estimating unit is configured to output a notification signal corresponding to a magnitude of the estimated charging/discharging current to the switching control unit, and
   the switching control unit is configured to individually control the operations of the first switch and second switch based on the notification signal.

2. The current estimation device of claim 1, further comprising two bus bars,
   wherein any one of the two bus bars is configured to connect one end of each of the shunt resistor and the shunt capacitor to the first node, and
   the other one of the two bus bars is configured to connect the other end of each of the shunt resistor and the shunt capacitor to the second node.

3. The current estimation device of claim 1, wherein the current estimating unit is configured to calculate a current average value of the charging/discharging current estimated a predetermined number of times for a predetermined period of time, and output a first notification signal when the current average value is smaller than a pre-determined current threshold value, and
   the switching control unit is configured to turn on both the first switch and the second switch according to the first notification signal.

4. The current estimation device of claim 1, wherein the current estimating unit is configured to calculate a current average value of the charging/discharging current estimated a predetermined number of times for a predetermined period of time, and output a second notification signal when the current average value is larger than a pre-determined current threshold value, and
   the switching control unit is configured to turn off both the first switch and the second switch according to the second notification signal.

5. A battery pack comprising the current estimation device according to claim 1.

6. An automobile comprising the current estimation device according to claim 1.

* * * * *